United States Patent [19]

Proscia

[11] Patent Number: 5,124,180
[45] Date of Patent: Jun. 23, 1992

[54] METHOD FOR THE FORMATION OF FLUORINE DOPED METAL OXIDE FILMS

[75] Inventor: James W. Proscia, Dearborn, Mich.
[73] Assignee: BTU Engineering Corporation, North Billerica, Mass.
[21] Appl. No.: 667,561
[22] Filed: Mar. 11, 1991
[51] Int. Cl.$^5$ .............................................. C23C 16/00
[52] U.S. Cl. .......................... 427/255.3; 427/255.5; 427/314; 427/372.2
[58] Field of Search ............... 427/255.3, 255.5, 314, 427/372.2

[56] References Cited

U.S. PATENT DOCUMENTS

| Re. 31,708 | 10/1984 | Gordon | 427/126.2 |
|---|---|---|---|
| 3,306,768 | 2/1967 | Peterson | 117/106 |
| 3,650,815 | 3/1972 | Ghoshtagore et al. | 117/106 |
| 3,949,146 | 4/1976 | Kane et al. | 428/432 |
| 4,146,657 | 3/1979 | Gordon | 427/126 |
| 4,377,613 | 3/1983 | Gordon | 428/212 |
| 4,500,567 | 2/1985 | Kato et al. | 427/255.3 |
| 4,508,054 | 4/1985 | Baumberger et al. | 118/718 |
| 4,529,627 | 7/1985 | Zurbig | 427/255 |
| 4,590,096 | 5/1986 | Lindner | 427/109 |
| 4,696,837 | 9/1987 | Lindner | 427/255.3 |
| 4,751,149 | 6/1988 | Vijayakumar et al. | 428/702 |

FOREIGN PATENT DOCUMENTS 86-091646/14 7/1984 Japan .

Primary Examiner—Bernard Pianalto
Attorney, Agent, or Firm—Weingarten, Schurgin, Cagnebin & Hayes

[57] ABSTRACT

The invention relates to a method of producing a substantially haze free, fluorine doped metal oxide coating on a substrate such as glass. The method includes the steps of heating a surface of the substrate to be coated, contacting the surface with a vapor including a metal oxide precursor, an oxidizing agent, and a dopant containing a chemically reactive vinylic fluorine atom, and thermally oxidizing the vapor into a fluorine containing metal oxide film.

Another feature of the invention is an apparatus for producing a uniform, substantially haze free, fluorine containing metal oxide thin film coating on a substrate such as glass. The apparatus includes a heater to heat the substrate to between approximately 450° and 600° C. and a conveyor to convey the heated substrated to a reaction zone adjacent an injector head. The injector head produces a vapor containing a metal oxide precursor, an oxidizing agent, and a dopant containing a chemically reactive vinylic fluorine atom. The vapor is oxidized into a fluorine containing metal oxide coating on the substrate.

18 Claims, 3 Drawing Sheets

| METAL PRECURSOR | OXIDIZING [3] AGENT | DOPANT |
| --- | --- | --- |
| monobutyl tin trichloride | oxygen, H₂O, Alcohol [2] | compound with a vinylic fluorine |
| dimethyl tin dichloride | H₂O, Alcohol [2] | compound with a vinylic fluorine |
| tetramethyl tin | oxygen | compound with a vinylic fluorine |
| tin chloride | H₂O, Alcohol [2] | compound with a vinylic fluorine |

1. e.g. chlorotrifluoroethylene, difluoroethlene, vinyl fluoride 2. e.g. methanol, ethanol, isopropanol 3. individually or as mixtures

*FIG. 2*

METHOD FOR THE FORMATION OF FLUORINE DOPED METAL OXIDE FILMS

FIELD OF THE INVENTION

This invention relates to fluorine containing metal oxide coatings on substrates and methods for producing such coatings.

BACKGROUND OF THE INVENTION

Metal oxides may be deposited as very hard thin films to act as thermal insulators on glass and other substrates or to form transparent electrodes for use with solar cells or other electo-optical devices. One method of deposting such films is by atmospheric pressure chemical vapor deposition (APCVD). In APCVD, the substrate to be coated, such as glass, is heated to an elevated temperature and exposed to a vapor containing a metal oxide precursor or a metal oxide precursor and a dopant. The vapor is thermally reacted on or near the surface of the substrate and is deposited as a metal oxide coating on the substrate.

A number of metal oxide precursors and dopant combinations are known to the prior art. Fluorine has been used as a dopant to create a hard oxide coating having high transparency as well as high conductivity. An example of such a metal oxide coating, in which there has been considerable interest, is tin oxide doped with fluorine. A method of producing this film has been to use tin tetrachloride as the metal oxide precursors, water as the oxidizing agent and hydrofluoric acid as the dopant. The tin oxide film deposited tends to be hazy and thereby may be unappealing for various (e.g. architectural) applications.

The present invention relates to various metal oxide precursors and dopants containing chemically reactive vinylic fluorine and methods which can be used to produce a uniform, substantially haze free, metal oxide film on a substrate such as glass.

SUMMARY OF THE INVENTION

The invention relates to a method of producing a substantially haze free, fluorine doped metal oxide coating on a substrate. The method includes the steps of heating a surface of the substrate to be coated, contacting the surface with a vapor including a metal oxide precursor, an oxidizing agent, and a dopant containing a chemically reactive vinylic fluorine atom, and thermally oxidizing the vapor into a fluorine containing metal oxide film.

Another feature of the invention is an apparatus for producing a uniform, substantially haze free, fluorine containing metal oxide thin film coating on a substrate. The apparatus includes a heater to heat the substrate to between approximately 450° C. and 600° C. and a conveyor to convey the heated substrate to a reaction zone adjacent an injector head. An injector head produces a vapor containing a metal oxide precursor, an oxygen containing compound, and a dopant containing a chemically reactive vinylic fluorine atom. The vapor is reacted into a fluorine containing metal oxide coating on the substrate.

DESCRIPTION OF THE DRAWING

The invention may be pointed out with particularity in the appended claims. The above and further advantages of this invention may be better understood by referring to the following description taken in conjunction with the accompanying drawings in which:

FIG. 1b is an expanded view of the plenum of FIG. 1a; and

FIG. 2 is a table of chemical precursors which may be used in conjunction to form the fluorine containing metal oxide film of the invention.

DESCRIPTION OF THE PREFERRED EMBODIMENT

Figure 1A:
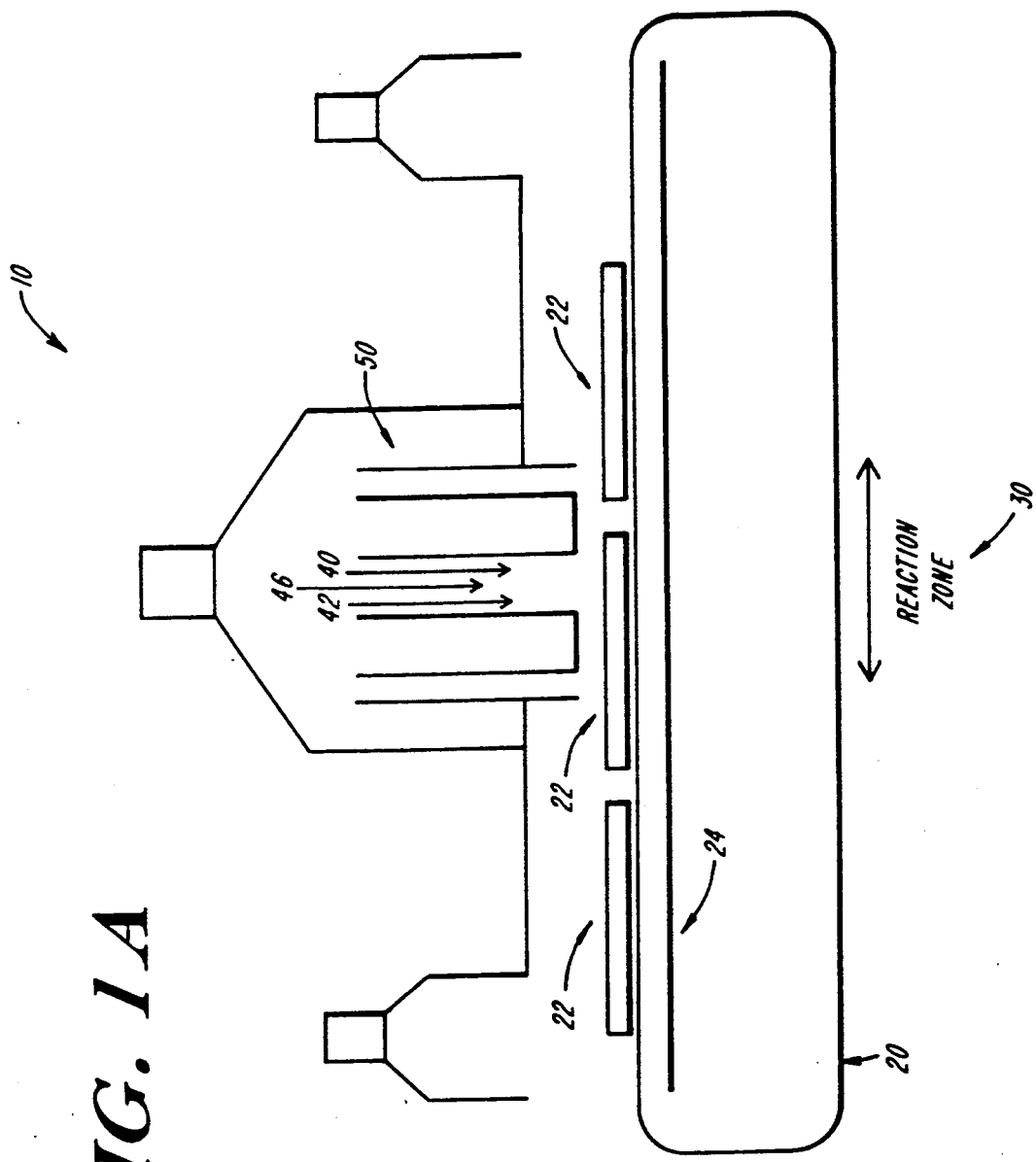
FIG. 1a is a highly schematized diagram of an embodiment of an atmospheric pressure chemical vapor deposition apparatus of the invention.

Referring to FIG. 1a, an embodiment of the atmospheric pressure chemical vapor deposition apparatus 10 which may be used to form uniform fluorine containing metal oxide films of the invention includes a conveyor belt 20 upon which the substrate 22 to be coated, such as glass, is positioned. The substrate 22 is heated to between 450 and 600 degrees celsius by a heater 24 and moved into the reaction zone 30 where it is exposed to the vapors of the metal oxide precursor 40, the oxidizing agent 42, and fluorine dopant 46 which are emitted by an injector head 50. Each of the compounds may be brought to the injector head 50 in a vapor phase by bubbling an inert carrier such as nitrogen gas through a bubbler containing the compound to be vaporized.

Figure 1B:
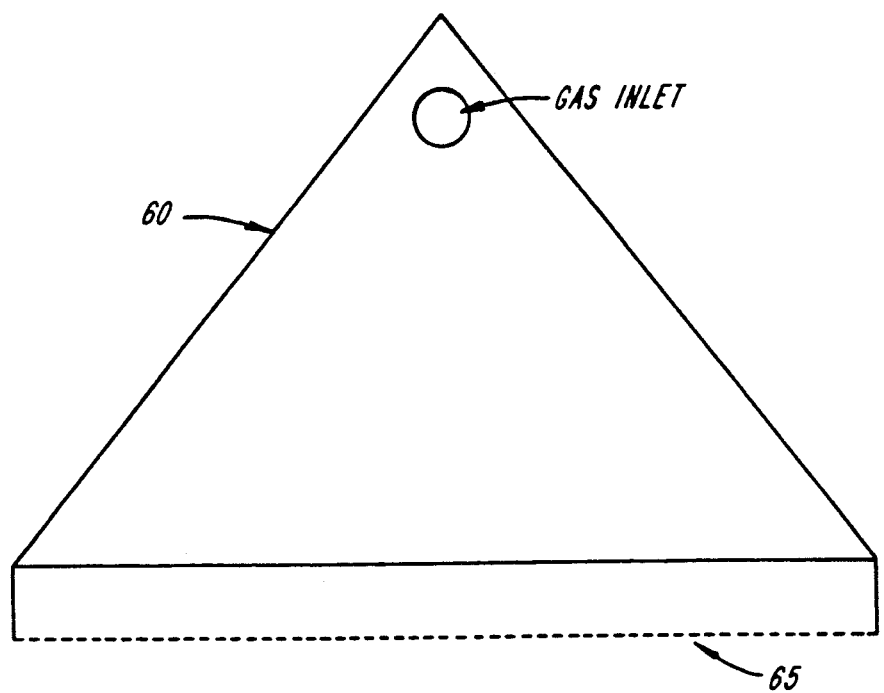

Referring also to FIG. 1b, to produce a uniform coating, the vapors of the metal oxide precursor 40, and the fluorine dopant 46 are delivered to the injector head 50 by means of a v-shaped channel 60 which feeds the gases through a series of holes 65. The channel 60 should be narrow, of the order of 1/32".

Referring to FIG. 2, in the embodiments disclosed herein, the fluorine dopant used in forming a fluorine doped metal oxide film is a chemically reactive vinylic fluorine of the form

where A, B, D may be H, F, or an alkyl group. Examples of useful vinyl fluorides include, but are not limited to chlorotrifluoroethylene

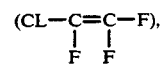

difluoroethylene

and vinyl fluoride

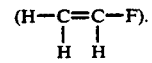

These dopants especially may be used to produce thin films of fluorine doped oxides of titanium and tin. Examples of useful metal oxide precursors for these films include, but are not limited to, monobutyl tin chloride, dimethyl tin dichloride, tetramethyl tin, tin chloride and titanium tetrachloride. In general, for the formation of tin oxides, halogenated tin compounds, especially organo-tins and tin tetrachloride, having a vapor pressure greater than or equal to approximately 10 torr at between about 0° C. to 150° C., are suitable for deposition.

To form the metal oxide from the metal oxide precursors, a suitable oxygen containing agent must also be supplied. The suitability of the oxygen containing agent is determined, in part, by the metal oxide precursor chosen. For example, hydroxylated compounds such as short chain alcohols and water are especially useful when tin halides are used for precursors. The rate of thin film formation when hydroxylated compounds are used, is determined by the reactivity of the oxygen containing agent. This activity, in turn, is determined, in part, by the size of hydroxylated compound. That is, the larger the moiety to which the —OH group is attached, the less its reactivity. Therefore, water is typically the most reactive, followed, in order, by methanol, ethanol and isopropanol. Oxygen is useful with organo-tin compounds and oxygen, or hydroxylated compounds or combinations of both are useful with organo-tin halides.

Examples of such mixtures of precursors include:
tin chloride + $H_2O$ + alcohol + difluoroethylene
tetramethyl tin + $O_2$ + difluoroethylene
tin tetrachloride + $H_2O$ or alcohol + difluoroethylene It is important to note that when tin tetrachloride is used with water or alcohol, the tin tetrachloride will undergo an hydrolysis reaction at room temperature. Therefore it is important that the tin tetrachloride vapor and water vapor be mixed at the injector head 50 just prior to deposition on the substrate 22.

The choice of metal oxide precursor and therefore oxidizing agent is, in part, determined by the use to which the thin film is to be put. Oxides of tin are especially useful in the production of transparent electrodes for solar cells, liquid crystal displays, and electrochromic devices. Tin oxide is especially useful in the reflection of infrared radiation and so is used to form low heat glass. Titanium oxide is useful as an insulator between the tin oxide layer and the silicon substrate in solar cells. The conductivity of the metal oxide films is determined, in part, by the fluorine dopant concentration. Such films may be produced having conductivities of about $4 \times 10^{-4}$ ohms/cm.

It is in the production of thin film coated glass having reduced haze that the above described method is particularly useful. To appreciate the degree of improvement in the conductivity and transparency of such films produced on glass, separate glass samples were respectively coated tin oxide and fluorine doped tin oxide using a vinyl fluoride as the dopant. Light transmission and the electrical conductivity for each sample were then measured.

To produce the undoped tin oxide film, a vapor of 2.6% by volume of tin tetrachloride in nitrogen at a flow rate of 2.0 liters/min. was reacted with a 2.5% by volume of water vapor in nitrogen at a rate of 1.0 liter/min in an 8 inch wide APCVD reactor at 570° C. The two reactants were kept separated by a stream of nitrogen at a flow rate of 2.0 liters/min until the reactants approximately reached the surface of the sample substrate, a sheet of Corning 7059 glass. The thin film tin oxide produced was about 4200 A thick and had a resistivity of 52.8 ohms/cm$^2$ and a diffuse transmission of 4%.

The fluorine doped thin film also was created on Corning 7059 glass substrate in a similar fashion, except that chlorotrifluoroethylene was added to the tin tetrachloride vapor at a rate of 1.0 liter/min. The fluorine doped thin film produced was also about 4200 A thick but had a resistivity of 11.8 ohms/cm$^2$ and a diffuse transmission of 1%.

It will be apparent to one skilled in the art that variations and modifications of the embodiment shown are possible which will still be within the scope and spirit of the invention. It is the intent therefore to limit the invention only by the scope of the claims.

What is claimed is:

1. A method of producing a substantially haze free fluorine doped metallic oxide coating on a substrate comprising the steps of:
   heating a surface of the substrate;
   contacting said surface with a vapor comprising:
   a metal oxide precursor,
   an oxygen containing agent;
   a dopant containing a vinylic fluorine; and
   thermally reacting said vapor into a fluorine containing metal oxide.

2. The method of claim 1 wherein the step of heating the surface causes the temperature of said surface to reach between approximately 450° C. and 600° C.

3. The method of claim 1 wherein said metal oxide precursor is a tin halide.

4. The method of claim 3 wherein said tin halide is tin tetrachloride.

5. The method of claim 4 wherein said oxygen containing agent is a hydroxylated compound.

6. The method of claim 5 herein said hydroxylated compound is water.

7. The method of claim 5 wherein said hydroxylated compound is a low molecular weight alcohol.

8. The method of claim 1 wherein said vinylic fluorine dopant is chlorotrifluoroethylene.

9. The method of claim 1 wherein said vinylic fluorine dopant is difluoroethylene.

10. The method of claim 1 wherein said metallic oxide precursor is an organo-tin compound.

11. The method of claim 10 wherein said organo-tin compound is tetramethyl tin.

12. The method of claim 10 wherein said oxygen containing agent is oxygen.

13. The method of claim 1 wherein said metallic oxide precursor is an organo-tin halide.

14. The method of claim 13 wherein said oxygen containing agent is one of the group comprising oxygen, water and low molecular weight alcohols.

15. A method of providing a tin oxide thin film layer on a substrate comprising the steps of:
   heating a surface of the substrate;
   contacting said surface with a vapor comprising:
   a tin chloride,
   an hydroxylated compound; and
   a dopant containing a vinylic fluorine; and
   thermally reacting said vapor into a fluorine containing metal oxide.

16. The method of claim 15 wherein said hydroxylated compound is water.

17. The method of claim 15 wherein said hydroxylated compound is an alcohol.

18. A method of producing a high conductivity fluorine containing titanium oxide layer on a substrate comprising the steps of:
   heating a surface of the substrate;
   contacting said surface with a first vapor comprising:

tin tetrachloride and a dopant containing a vinylic fluorine; and a second vapor comprising an hydroxylated compound; and mixing said first vapor and second vapor near the surface of the substrate, and thermally reacting said vapor into a fluorine containing titanium oxide thin film.

* * * * *

UNITED STATES PATENT AND TRADEMARK OFFICE
CERTIFICATE OF CORRECTION

PATENT NO. : 5,124,180
DATED : June 23, 1992
INVENTOR(S) : James W. Proscia

It is certified that error appears in the above—identified patent and that said Letters Patent is hereby corrected as shown below:

Column 3, line 44, "conductivities" should read --resistivities--.

Column 3, line 45, "ohm/cm" should read --ohms-cm--.

Column 3, line 64, "resistivity" should read --sheet resistance--.

Column 3, line 65, "ohms/cm$^2$" should read --ohms per square--.

Column 4, line 4, "resistivity" should read --sheet resistance--.

Column 4, line 4, "ohms/cm$^2$" should read --ohms per square--.

Column 5, line 1, "tin" should read --titanium".

Signed and Sealed this

First Day of February, 1994

Attest:

BRUCE LEHMAN

Attesting Officer     Commissioner of Patents and Trademarks